United States Patent [19]
Mutrux

[11] 4,408,897
[45] Oct. 11, 1983

[54] ELECTRONIC TIMEPIECE HAVING A DIGITAL FREQUENCY CORRECTION CIRCUIT

[75] Inventor: Claude Mutrux, Cernier, Switzerland

[73] Assignee: Ebauches Electroniques S.A., Marin, Switzerland

[21] Appl. No.: 421,390

[22] Filed: Sep. 22, 1982

[51] Int. Cl.[3] .......................... G04C 3/00; G04C 9/00; H03K 1/17

[52] U.S. Cl. .................................... 368/200; 368/201; 368/202

[58] Field of Search ......................... 368/200, 201, 202

[56] References Cited

U.S. PATENT DOCUMENTS

| | | | |
|---|---|---|---|
| 4,117,663 | 10/1978 | Mosimann et al. | 368/201 |
| 4,147,022 | 4/1979 | Ichikawa | 368/201 X |
| 4,150,536 | 4/1979 | Nakajima et al. | 368/200 X |
| 4,154,053 | 5/1979 | Chetelat et al. | 368/201 X |
| 4,155,218 | 5/1979 | Wiget | 368/201 X |
| 4,173,863 | 11/1979 | Motoki et al. | 368/200 X |
| 4,176,517 | 12/1979 | Yoshida | 368/201 |
| 4,199,726 | 4/1980 | Bukosky et al. | 368/200 X |
| 4,225,824 | 9/1980 | Sekine et al. | 368/200 X |
| 4,254,494 | 3/1981 | Maeda | 368/200 X |
| 4,264,968 | 4/1981 | Suzuki et al. | 368/201 |

*Primary Examiner*—J. V. Truhe
*Assistant Examiner*—Terry L. Flower
*Attorney, Agent, or Firm*—Philip M. Hinderstein

[57] ABSTRACT

An electronic timepiece comprising a rate correction circuit for modifying the number of time base pulses received by the frequency divider during a predetermined period of time by a predetermined number of correction pulses. The rate correction circuit is arranged to divide said period of time into a given number of sub-periods and to distribute correction pulses substantially and equally over these sub-periods.

2 Claims, 6 Drawing Figures

ELECTRONIC TIMEPIECE HAVING A DIGITAL FREQUENCY CORRECTION CIRCUIT

BACKGROUND OF THE INVENTION

The present invention relates to electronic timepieces whose time base frequency can be adjusted by means of a digital frequency correction circuit. The invention concerns more particularly an electronic timepiece or watch including means for producing time base pulses, a frequency divider which receives said time base pulses, a rate correction circuit connected between said time base producing means and said frequency divider for modifying the number of pulses received by the frequency divider during a predetermined period of time by a predetermined number of correction pulses, a driver circuit connected to receive the output signal provided by said frequency divider and a time display divider controlled by said driving circuit.

In such an electronic timepiece, the adjustment by steps of the frequency of the time base pulses is carried out by the addition or the suppression of a given number of correction pulses over a predetermined period of time. It can be seen that, in order to obtain a sufficiently fine step adjustment of the frequency of said time base pulses, a sufficiently long period of correction must be used. A simple calculation shows that when the frequency of said signal is 16.384 Hz, the correction period must be equal to 20 seconds if an adjustment step of $\pm 1.5\ 10^{-6}$ is required.

In general, the frequency of the time base of an electronic timepiece is measured by an apparatus which measures the time elapsed between the first and the $n^{th}$ pulse of the low frequency signal which controls the display system of the timepiece, for example a stepping motor, n being a predetermined integer. The apparatus compares the value of the elapsed time given by the timepiece with a reference time interval, also called the integration period, in order to determine the frequency of the time base, i.e. the accuracy of the timepiece.

Now, if the addition or the suppression of correction pulses is made at each correction period, it is easy to see that, in order to obtain a precise measurement of the frequency, an apparatus having an integration period equal to said correction period is required. The integration times are standardized, while the correction period can vary from one timepiece to another, depending upon the desired accuracy of the frequency adjustment step, or upon the internal design of the timepiece. Therefore, if this condition is not fulfilled, it will be impossible to test the timepiece by a standard measuring apparatus.

SUMMARY OF THE INVENTION

For the above mentioned reason, the main object of the present invention is to provide an electronic timepiece having a digital frequency correction circuit conceived to allow measurement of the frequency of the timepiece with a minimized error when the correction period used in the timepiece and the integration time of the measuring apparatus are not equal.

In accordance with the present invention, the rate correction circuit of the timepiece is arranged to divide said period of time in a given number of sub-periods and to distribute said correction pulses substantially, regularly over said sub-periods.

Thanks to the present invention, it is possible to measure with a good precision the frequency of a timepiece having, for example, a correction period of 20 seconds with a measuring apparatus whose integration time is 10 seconds.

BRIEF DESCRIPTION OF THE DRAWINGS

The characteristics and advantages of the invention will be better understood when a description using the following drawings has been read.

DETAILED DESCRIPTION OF THE PREFERRED EMBODIMENT

Figure 1:
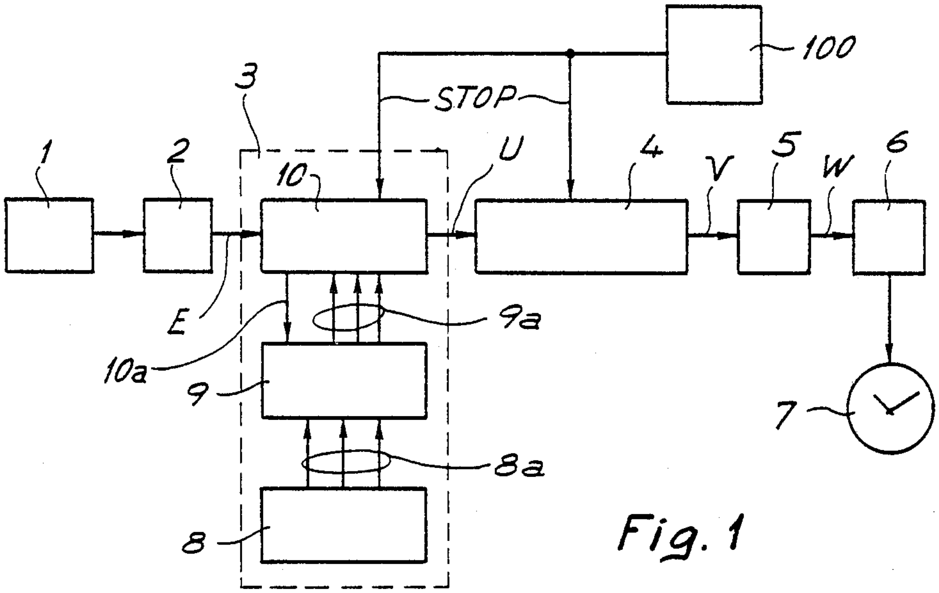
FIG. 1 is a synoptic diagram of an analog electronic watch in accordance with one embodiment of the present invention.
Figure 6:
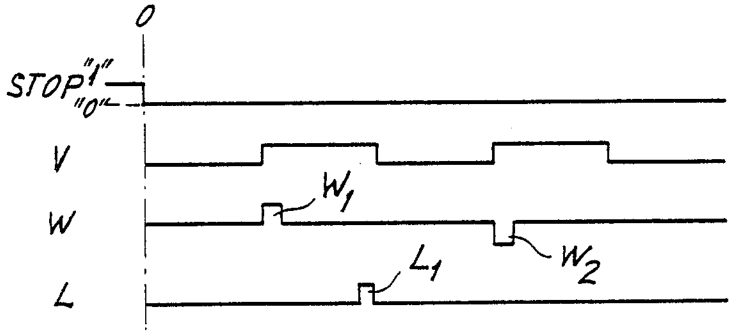
FIG. 6 is a waveform diagram of signals used in the watch shown in FIG. 1.

The watch represented in FIG. 1 consists of a quartz oscillator 1, a divide by two and shaping circuit 2 which receives the signal supplied by the oscillator 1, and a frequency (or pulse rate) correction circuit 3 which receives a time base signal E formed of pulses supplied by the shaping circuit 2 and supplies a signal U which is formed of the signal E in which, at each correction period Z, a predetermined number A of pulses has been suppressed, or inhibited. The signal U is divided by a divider circuit 4 to obtain a low frequency signal V, for example 1 Hz, which is supplied to a driver circuit 5 which in turn converts the signal V into a signal W consisting of brief pulses of 7.8 milli-seconds for example, which succeed each other at 1 second intervals and have alternating polarity, as is illustrated in FIG. 6. The signal W is supplied to an electromagnetic motor 6 which drives the hands of an analog display 7.

The rate correction circuit 3 consists of a programmable memory 8 in which is stored the number A of pulses to be inhibited during each period of correction Z, a repartition circuit 9 whose function is to elaborate the numbers $A_i$ of pulses which must be suppressed during each sub-period of correction $Z_i$ and a logic circuit 10 which determines the sub-periods and stops the transmission, during each sub-period of correction $Z_i$, of $A_i$ pulses of the time base signal E to the divider 4. The repartition circuit 9 receives the information stored in the memory 8 by means of a bus **8*a*, and transmits the information $A_i$ to the logic circuit 10 by means of a bus 9*a*. The logic circuit 10 provides to the repartition circuit 9, by means of a bus 10*a***, an information signal on the number of sub-periods, which will now be described in greater detail.

In accordance with an example, each correction period Z is 20 seconds long. The period Z is divided into 2 sub-periods $Z_1$ and $Z_2$, each equal to 10 seconds. The high-frequency time base signal E provided by the shaping circuit 2 has a frequency of 16,384 Hz and the number of pulses of signal E which must be inhibited during each correction period is 7. During the first sub-period $Z_1$, the repartition circuit 9 supplies to the logic circuit 10 information corresponding to the number 3, in order that this latter circuit eliminates 3 pulses from the signal E during the first sub-period $Z_1$. During the second sub-period $Z_2$, the repartition circuit 9 supplies to the logic circuit 10 information corresponding to the number 4, in order that this latter circuit eliminates 4 pulses from the signal E during the second sub-period $Z_2$.

Figure 2:
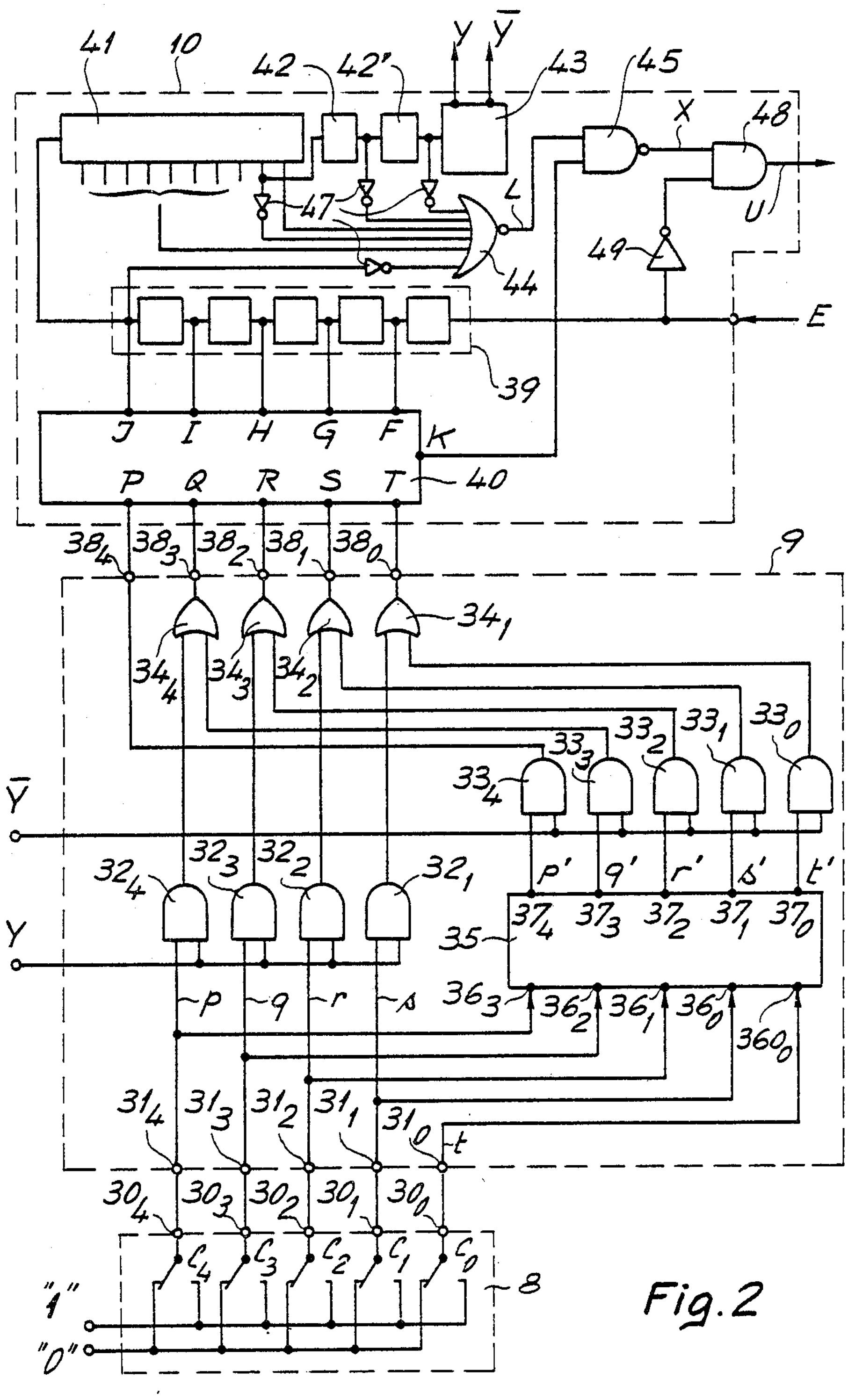
FIG. 2 is the circuit diagram of the blocks 8, 9 and 10 shown in FIG. 1.

FIG. 2 illustrates an example of the rate correction circuit 3 shown in FIG. 1. The memory 8 consists of five switches $C_0$, $C_1$, $C_2$, $C_3$, $C_4$. Each switch is connected to a logic level "0" or low, to a logic level "1" or high, and to an output, respectively noted $30_0$ to $30_4$, which will take on a low logic level or a high logic level in accordance with the position of the corresponding contact of the switch C.

The logic state of the outputs $30_4$ to $30_0$, taken in this order, defines a binary number having five bits and representing the number A mentioned above. This number may have 32 different values from 0 to 31 and it will be written in binary form pqrst, where p,q,r,s,t represent respectively the logic state ("0" or "1") of the outputs $30_4$, $30_3$, $30_2$, $30_1$ and $30_0$.

Each output $30_0$ to $30_4$ is connected to an input having the same subscript, $31_0$ to $31_4$, of the repartition circuit 9. This latter circuit consists of four AND gates $32_1$ to $32_4$, five AND gates $33_0$ to $33_4$, four OR gates $34_1$ to $34_4$ and a four bit adder circuit 35 having four primary inputs $36_0$ to $36_3$, four secondary inputs of which only the input $360_0$, corresponding to the least significant bit, has been shown, and five outputs $37_0$ to $37_4$. The adder circuit 35 is, for example, the type of circuit described in chapter 5 of the book "Digital Principles and Applications" by A. P. Malvino and D. P. Leach, published in 1969 by McGraw-Hill Book Company.

The connections $31_4$ to $31_1$ whose logic states define a number a, written pqrs in binary form, are each connected, on the one hand, to a first input of an AND gate $32_4$ to $32_1$ having the same subscript and, on the other hand, to a respective input $36_3$, $32_2$, $36_1$, $36_0$ of the adder circuit 35. The connection $31_0$ whose logic state defines the bit t is only connected to input $360_0$ of the adder 35. This latter supplies at its output, comprising the connections $37_4$ to $37_0$, a number a' whose value a+t will be written p'q'r's't' in binary form.

Each output $37_0$ to $37_4$ of the adder 35 is respectively connected to a first input of AND gates $33_0$ to $33_4$. The four OR gates $34_1$ to $34_4$ have each two inputs and one output. The first input of each OR gate $34_1$ to $34_4$ is respectively connected to the output of AND gates $33_0$ to $33_3$. The second input of each OR gate $34_1$ to $34_4$ is respectively connected to the output of AND gates $32_1$ to $32_4$. The repartition circuit 9 has five outputs $38_0$ to $38_4$. The first four outputs $38_0$ to $38_3$ are connected to the output of the gates $34_1$ to $34_3$ respectively. The output $38_4$ is connected to the output of the AND gate $33_4$.

All the second inputs of the AND gates $32_1$ to $32_4$ are connected together and receive a logic control signal Y. Similarly, all the second inputs of the AND gates $33_0$ to $33_4$ are connected together and receive a logic control signal Y, this signal being the complement of the signal Y.

The logic state of the connections $38_4$, $38_3$, $38_2$, $38_1$ and $38_0$, taken in this order, define a five bits binary number B, which will be written PQRST.

The function of the repartition circuit 9 is to divide into two groups $A_1$ and $A_2$, being as equal as possible, the number A contained in the memory. These two groups should be equal if A is an even number, or different the one from the other by one unit if A is odd. Considering the number a, written pqrs in binary form, it is evident that it represents the integer part of A/2. Further, the compliment of A to a is the number a'=a+t, or p'q'r's't' in binary form. Thus if A is even, then t=0 and a=a'=a/2, if A is odd, then t=1 and a=(A−1)/2, a'=(A+1)/2. This represents precisely the conditions which must be fulfilled by $A_1$ and $A_2$; therefore it will be set down that $A_1$=a and $A_2$=a'.

The number a is thus obtained simply by eliminating the bit t in the number A, written in binary form.

The logic information corresponding to the number a is supplied by the memory 8 to the first inputs of the AND gates $32_1$ to $32_4$. When the logic control signal Y for these gates is at high logic level, this information is transmitted to the outputs of these same gates. The number a' is obtained with the aid of the adder 35 which calculates the sum a+t. The logic information corresponding to the number a' is given by the outputs of the adder 35 and is supplied to the first inputs of the AND gates $33_0$ to $33_4$. When the logic control signal Y for these AND gates is at high logic level, this information is transmitted to the outputs of these same gates. Since the logic control signals Y and Y are complementary, the logic information corresponding to the numbers a and a' is alternatively present at the outputs of the gates $32_1$ to $32_4$ and $33_1$ to $33_4$ respectively. Thus at the outputs $38_0$ to $38_3$, the logic information corresponding to the number a appears when the logic control signal Y is at high logic level and, when this logic controls signal is at low logic level, the information corresponding to the four least significant bits q'r's't' of the number a' appears at the outputs $38_0$ to $38_3$, whilst the most significant bit p' is directly transmitted to the output $38_4$.

Thus, it can be seen that the repartition circuit 9, on the one hand, when the logic control signal Y is at high logic level, gives the number a, equal to $A_1$ and, on the other hand, when the logic control signal Y is at low logic level, gives the number a', equal to $A_2$. In addition, the repartition circuit 9 determines the numbers a and a', which are respectively equal to $A_1$ and $A_2$, in such a way that $A_1=A_2=A/2$ when A is an even number and $A_1=(A-1)/2$, $A_2=(A+1)/2$ when A is an odd number.

The logic circuit 10 comprises a first chain of dividers 39 made up of five binary dividers connected in series, this chain of dividers is driven by the signal E, and a comparator 40 which compares the state of the output of each binary divider 39 with the state of, respectively, each output $38_0$ to $38_4$ of the repartition circuit 9. The logic circuit 10 also comprises a second chain of dividers 41 connected at the end of the first chain of dividers 39, this second chain of dividers having ten binary dividers connected in series. Next to the last low frequency output of the chain of dividers 41 is connected to the input of a divide by five circuit 42, whose output is connected to the input of a binary divider 42', which is followed by a second binary divider 43. The circuit 43 has an output which supplies the control signal Y and a complementary output which supplies the control signal Y, both signals having been already mentioned above. The inverted output of the last divider of the divider chain 39, the first eight outputs and the last output of the divider 41, and the inverted outputs of the divider 42 and 42', are each connected to a respective input of a NOR gate 44. The inversion of the signals is obtained by means of inverters 47. The output of the NOR gate 44 is connected to one of the inputs of a NAND gate 45. The NAND gate 45 has a second input connected to the output K of the comparator 40. Finally, the output of the NAND gate 45 is connected to one of the inputs of a two input AND gate 48 whose other input is connected, through an inverter 49, to the input which receives the signal E from the shaping circuit 2.

Figure 3:
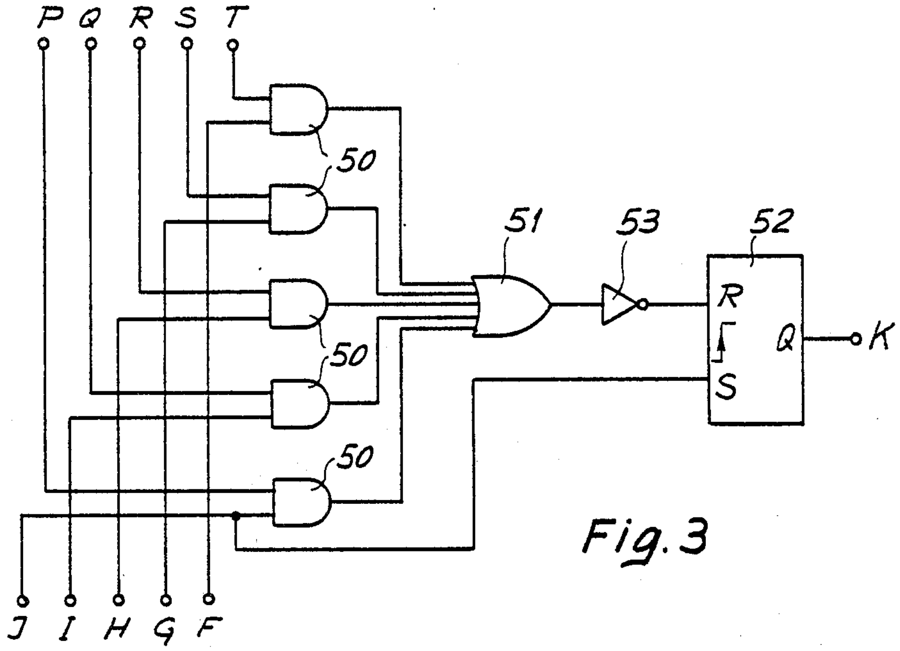
FIG. 3 is the circuit diagram of the comparator block 40 shown in FIG. 2.

FIG. 3 shows an embodiment of the comparator 40. As shown in this example, the comparator consists of five AND gates 50, one OR gate 51 and an RS edge controlled flip-flop 52. Each AND gate 50 has two inputs of which one is connected to one of the first inputs P,Q,R,S,T of the comparator, the other input is connected to one of the second inputs F,G,H,I,J of the same comparator 40. The first inputs of the comparator are connected to the outputs of the divider chain 39, as shown in FIG. 2. The second inputs of the comparator are connected to the outputs $38_0$ to $38_4$ of the repartition circuit 9, as shown in FIG. 2. The outputs of the AND gates 50 are each connected to the respective input of the OR gate 51, whose output is connected through an inverter 53 to the reset input R of the flip-flop 52. The trigger input S of the flip-flop 52 is connected to the input J of the comparator 40. Finally, the output Q of the flip-flop 52 is connected to the output K of the comparator 40.

The functioning of the correction circuit 3 will now be explained with the aid of the waveform-diagrams shown in FIGS. 4 to 6.

As shown in the example, the correction period Z is 20 seconds and the number A of pulses to be inhibited during each correction period is 7. This number A is subdivided into two numbers, $A_1$ equal to 3, and $A_2$ equal to 4.

Figure 4:
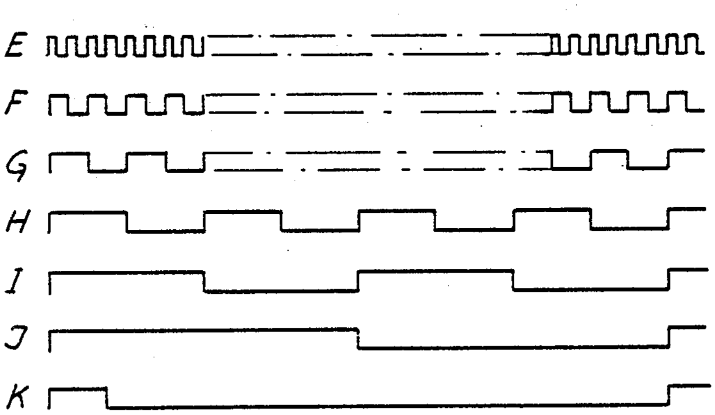
FIG. 4 is a waveform diagram of signals appearing in different points of the circuit shown in FIG. 3.

FIG. 4 shows the waveform of the time base signal E entering the logic circuit 10 and, in addition, the waveforms of the signals F,G,H,I,J which appear respectively at the output of each binary divider of the chain of dividers 39. Finally, FIG. 4 shows the waveform of the signal K which appears at the output, also designated K, of the comparator 40. The signal E is at a frequency of 16,384 Hz, and the signals F to J are respectively at the frequencies 8,192 Hz, 4,096 Hz, 2,048 Hz, 1,024 Hz and 512 Hz.

The signal K shown in FIG. 4 corresponds to the case where $P=Q=R=0$ and $S=T=1$, and for which the number $A_1$ is equal to 3. The signal diagrams shown in FIG. 5 cover the two sub-periods of correction $Z_1$ and $Z_2$. As it can be seen in FIG. 5, during the first sub-period $Z_1$, the signal K consists of pulses whose length $d_1$ corresponds to three periods of the signal E. During the second sub-period $Z_2$, the signal K consists of pulses whose length $d_2$ corresponds to four periods of the signal E.

Figure 5:
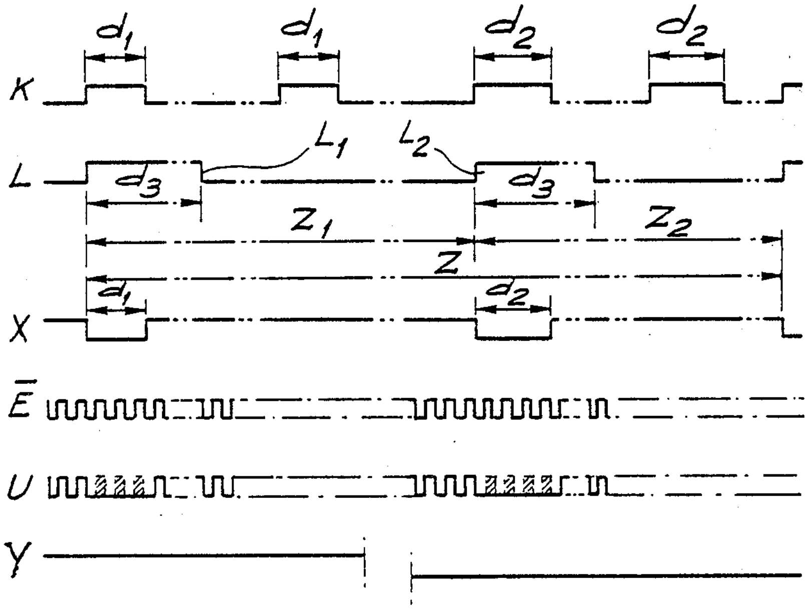
FIG. 5 is a waveform diagram of signals appearing in different points of the circuit shown in FIG. 2.

FIG. 5 also shows the waveform of the signal L which appears at the output of the NOR gate 44. As it can be seen in this figure, the signal L is composed of pulses which follow each other at 10 second intervals, the pulses having a constant length $d_3$ equal to 0.97 millisecond. The signal L is combined with the signal K in the NAND gate 45 to obtain a logic signal X which will have a low logic value "0" only when the signals K and L are simultaneously at high logic value "1". The pulses of the signal X follow each other at 10 second intervals and have a duration equal to the duration $d_1$ of the signal K pulses. Thus, as it can be seen in FIG. 5, the signal X presents a first pulse of length $d_1$, which appears at the beginning of the first sub-period $Z_1$, and a second pulse of length $d_2$, which appears at the beginning of the second sub-period $Z_2$. As the signal X is combined with the signal E in the AND gate 48, the signal U present at the output of this gate is the high-frequency adjusted signal. The frequency adjustment is performed by the suppression of pulses each 20 seconds, in particular, in the given example, 3 pulses are suppressed in the first period $Z_1$ to 10 seconds and four pulses are suppressed in the second period $Z_2$ of 10 seconds.

As it can be seen in FIG. 6, the signal V supplied by the divider 4 is a logic signal having a frequency of 1 Hz. The driver circuit 5, of well known type, transforms the signal V into driving pulses $W_1$, $W_2$ which are applied to the motor 6. As it is well known, the signal W comprises a train of driving pulses of alternating polarity following each other at 1 second intervals and having a relatively short length, for example 7.8 milliseconds.

Each driving pulse $W_1$, $W_2$ starts exactly at the same moment as a pulse of the signal V. Given the presence in the logic circuit 10 of the inverters 47, as shown in FIG. 2, the first pulse $L_1$ of the signal L appears between the first and the second driving pulses, respectively $W_1$ and $W_2$. That is to say, during the second operating cycle of divider 4, following the instant 0.

In FIG. 6 the number 0 shows the moment when a contact 100 (FIG. 1) is opened by pushing, for example, a time setting stem from a pulled-out position to its normal position. This contact 100, when closed, supplies a logic STOP signal "1", which blocks at zero all the counters and dividers of the watch circuit shown in FIG. 1. The opening of the contact 100 supplies a logic signal "0" which unlocks the counters and dividers 4, 39 and 41. The first driving pulse $W_1$ then appears exactly one second after this moment. The first inhibition of a group of 3 pulses of signal E is effected when the signal $L_1$ appears. Therefore this inhibition is effected between the first driving pulse $W_1$ and the second driving pulse $W_2$, and not during a driving pulse. This characteristic has the advantage to make easier the measurement of the oscillator frequency and of the number of inhibited pulses by the correction circuit 3.

What is claimed is:

1. An electronic timepiece comprising:
   - means for producing time base pulses;
   - a frequency divider connected to receive said time base pulses;
   - a pulse rate correction circuit connected between said time base pulses producing means and said frequency divider for modifying the number of pulses received by the frequency divider during a predetermined period of time by a predetermined number of correction pulses;
   - a driver circuit connected to receive the output signal provided by said frequency divider; and
   - a time display device controlled by said driving circuit, characterized in that said pulse rate correction circuit is arranged to divide said period of time into a given number of sub-periods and to distribute said correction pulses substantially equally over said sub-periods.

2. An electronic timepiece according to claim 1, wherein said pulse rate correction circuit includes:
   - a memory circuit for storing information representing said predetermined number;
   - a repartition circuit responsive to said information and a signal representing said given number of sub-periods for elaborating a sequential logic signal, each sequence of which represents the number of correction pulses in each sub-period; and a logic circuit comprising means for producing said signal representing said given number of sub-periods and means responsive to said sequential logic signal for modifying the number of time base pulses in each sub-period.

* * * * *